United States Patent
Park et al.

(10) Patent No.: US 12,001,019 B2
(45) Date of Patent: Jun. 4, 2024

(54) DISPLAY APPARATUS REALIZING A VIRTUAL IMAGE

(71) Applicant: LG Display Co., Ltd., Seoul (KR)

(72) Inventors: Ju-Seong Park, Goyang-si (KR); Myung-Soo Park, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 334 days.

(21) Appl. No.: 16/711,303

(22) Filed: Dec. 11, 2019

(65) Prior Publication Data

US 2020/0201039 A1  Jun. 25, 2020

(30) Foreign Application Priority Data

Dec. 21, 2018  (KR) .................. 10-2018-0167109

(51) Int. Cl.
| | |
|---|---|
| *G02B 27/01* | (2006.01) |
| *B60K 35/00* | (2006.01) |
| *B60K 35/23* | (2024.01) |
| *G02B 5/20* | (2006.01) |
| *G02B 5/32* | (2006.01) |

(Continued)

(52) U.S. Cl.
CPC ........... *G02B 27/0103* (2013.01); *G02B 5/20* (2013.01); *G02B 5/32* (2013.01); *G02F 1/1335* (2013.01); *H10K 59/50* (2023.02); *B60K 35/00* (2013.01); *B60K 35/23* (2024.01); *B60K 2360/25* (2024.01); *B60K 2360/29* (2024.01); *B60K 2360/31* (2024.01); *B60K 2360/33* (2024.01);

(Continued)

(58) Field of Classification Search
CPC ............... G02B 27/01; G02B 27/0103; G02B 2027/0105; G02B 2027/0107; G02B 2027/0109; G02B 2027/0112; G02B 2027/0196; G02B 5/32; G02B 5/20; G02B 5/1335; H01L 27/3232; B60K 35/00; B60K 2370/1529; B60K 2370/29; B60K 2370/33; B60K 2370/25; B60K 2370/31; B60K 35/23; B60K 2360/25; B60K 2360/29; B60K 2360/31; B60K 2360/33; G02F 1/1335; H10K 59/50
See application file for complete search history.

(56) References Cited

U.S. PATENT DOCUMENTS 9,165,984 B2 * 10/2015 Hack ................... H01L 27/3209
10,088,685 B1 * 10/2018 Aharoni ............... G02B 6/0076
(Continued)

FOREIGN PATENT DOCUMENTS

| CN | 1578918 A | 2/2005 |
|---|---|---|
| CN | 1854828 A | 11/2006 |

(Continued)

*Primary Examiner* — Amy Onyekaba
*Assistant Examiner* — Cory A Almeida
(74) *Attorney, Agent, or Firm* — Seed IP Law Group LLP

(57) ABSTRACT

A display apparatus providing a virtual image to user is provided. The display apparatus may include a hologram optical element on a path of light emitted from a display panel. The display panel may emit light having different peak wavelength ranges. The reflection angle or the refraction angle recorded in the hologram optical element is different according to the peak wavelength range. Thus, the display apparatus may provide a plurality of virtual images having different focal lengths to the user without physical movement or mechanical operation of the display panel.

18 Claims, 4 Drawing Sheets

(51) Int. Cl.
*G02F 1/1335* (2006.01)
*H10K 59/50* (2023.01)

(52) U.S. Cl.
CPC ............... *G02B 2027/0112* (2013.01); *G02B 2027/0196* (2013.01)

(56) References Cited

U.S. PATENT DOCUMENTS

| | | | |
|---|---|---|---|
| 2004/0257628 A1 | 12/2004 | Mukawa | |
| 2006/0001977 A1* | 1/2006 | Shimizu | G02B 27/0103 359/630 |
| 2006/0221039 A1* | 10/2006 | Ishiguchi | G09G 3/3666 345/98 |
| 2007/0164955 A1* | 7/2007 | Noguchi | G02B 27/0101 345/89 |
| 2012/0162734 A1* | 6/2012 | Lambert | G02B 27/0103 359/13 |
| 2015/0160458 A1 | 6/2015 | Uno | |
| 2017/0269364 A1* | 9/2017 | Fujita | H04N 23/00 |
| 2019/0369393 A1* | 12/2019 | Misawa | G02B 27/0101 |

FOREIGN PATENT DOCUMENTS

| | | |
|---|---|---|
| CN | 102472894 A | 5/2012 |
| CN | 104395128 A | 3/2015 |
| CN | 105892057 A | 8/2016 |
| CN | 107843985 A | 3/2018 |
| CN | 108473055 A | 8/2018 |
| DE | 10 2017 208 339 A1 | 11/2018 |
| EP | 0724174 A1 | 7/1996 |
| WO | 2018/117012 A1 | 6/2018 |

* cited by examiner

DISPLAY APPARATUS REALIZING A VIRTUAL IMAGE

CROSS-REFERENCE TO RELATED APPLICATION(S)

This application claims the priority benefit of Korean Patent Application No. 10-2018-0167109, filed on Dec. 21, 2018, which is hereby incorporated by reference as if fully set forth herein.

BACKGROUND

Technical Field

The present disclosure relates to a display apparatus providing a virtual image to user.

Description of the Related Art

A display apparatus may provide information to a user through a virtual image. For example, a head-up display apparatus may inform the user driving information and/or warning on a wind-shield of a car by displaying the virtual image. Thus, in the car having the display apparatus, the driver's view may be sufficiently secured.

However, the virtual image realized the display apparatus may have a single focal length. Thus, when the virtual image by the display apparatus is realized on a real image, the user may feel a discrepancy due to the physical space difference between the real image and the virtual image. The display apparatus may use a plurality of display panels or move the position of the display panel according to the virtual image to be realized in order to change the focal length of each virtual image. Thus, in the display apparatus, a physical space may be increased, or an optical system for realizing a virtual image may be unstable.

BRIEF SUMMARY

Accordingly, the present disclosure is directed to a display apparatus that substantially obviates one or more problems due to limitations and disadvantages of the related art.

In various embodiments, the present disclosure provides a display apparatus capable of reducing or minimizing the physical space and improving the visibility of the user.

In some embodiments, the present disclosure provides a display apparatus realizing a plurality of virtual images having different focal lengths without physical movement or mechanical operation of the display panel.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, there is provided a display apparatus including a display panel. The display panel emits light having a first peak wavelength range, and light having a second peak wavelength range. A hologram optical element is disposed on a path of the light emitted from the display panel. The refraction angle of the light having the second peak wavelength range by the hologram optical element is different from the refraction angle of the light having the first peak wavelength range by the hologram optical element.

The light having the second peak wavelength range may realize a color different from the light having the first peak wavelength range.

The hologram optical element may have a stacked structure of a first hologram optical layer in which the refraction angle of the light having the first peak wavelength range was recorded, and a second hologram optical layer in which the refraction angle of the light having the second peak wavelength range was recorded.

The display panel may include a light-emitting layer between a first electrode and a second electrode.

In another embodiment, a display apparatus includes a hologram optical element on a wind-shield. A display panel emits light to realize a first image and light to realize a second image toward the hologram optical element. The reflection angle of the light to realize the second image recorded in the hologram optical element is different from the reflection angle of the light to realize the first image recorded in the hologram optical element.

The hologram optical element may be in contact with a surface of the wind-shield toward the display panel.

The light to realize the second image may realize the same color as the light to realize the first image.

The display panel may include a first color filter displaying a first color, and a second color filter displaying a second color. The second color may be different from the first color. The second color filter may include a material different from the first color filter.

The display panel may include a first light source and a second light source. The second light source may emit light displaying the same color as the first light source. The peak wavelength range of light emitted from the second light source may be different from the peak wavelength range of light emitted from the first light source.

In some embodiments, a display apparatus includes a display panel configured to emit light having a plurality of peak wavelength ranges, and a hologram optical element disposed on a path of the light emitted from the display panel, wherein the hologram optical element refracts the light at different refraction angles based on the peak wavelength ranges.

In some embodiments, a display apparatus includes a hologram optical element on a wind-shield, and a display panel configured to emit light to display a plurality of images to the hologram optical element, wherein the hologram optical element reflects the light at a plurality of different reflection angles.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
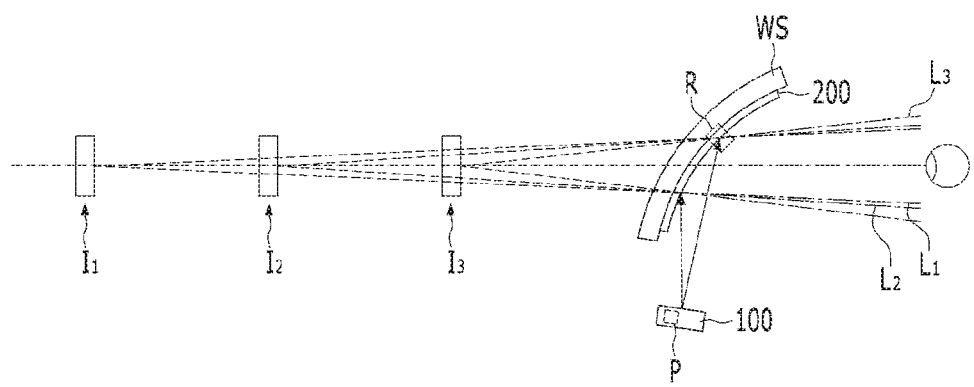
FIG. 1 is a view schematically showing a display apparatus according to an embodiment of the present disclosure, and a movement path of light.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2A:
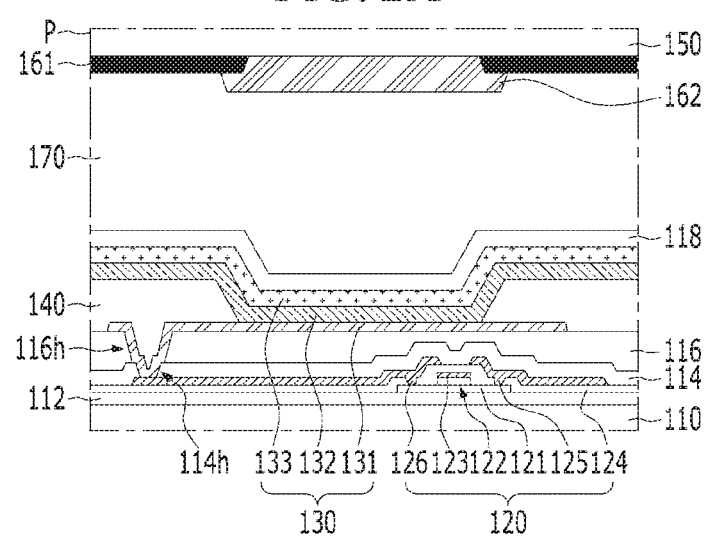
FIG. 2A is an enlarged view showing a single pixel region P of the display apparatus according to the embodiment of the present invention.
Figure 2B:
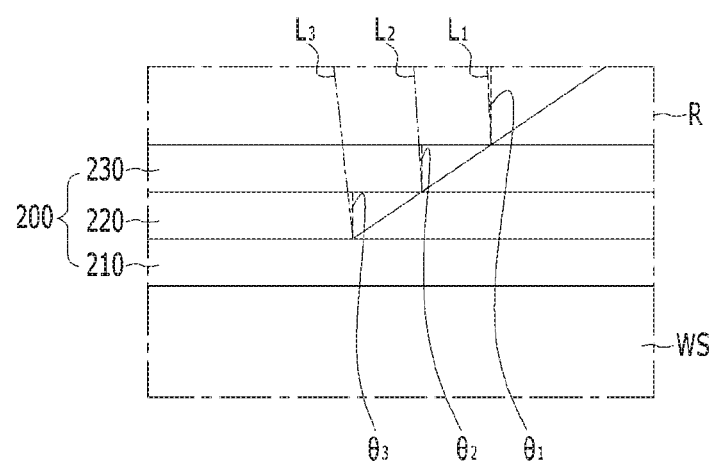
FIG. 2B is an enlarged view of R region in FIG. 1.

FIG. 1 is a view schematically showing a display apparatus according to an embodiment of the present disclosure, and a movement path of light. FIG. 2A is an enlarged view showing a single pixel region P of the display apparatus according to the embodiment of the present disclosure. FIG. 2B is an enlarged view of R region in FIG. 1.

Referring to FIGS. 1, 2a and 2b, the display apparatus according to the embodiment of the present disclosure may include a display panel 100. The display panel 100 may display virtual images I1, I2 and I3 provided to a user. The virtual images I1, I2 and I3 displayed by the display panel 100 may be transmitted to the user through a wind-shield WS. For example, the display apparatus according to the embodiment of the present disclosure is a head-up display apparatus informing a driver driving information and/or warning needed by the driver by displaying one or more virtual images on the wind-shield WS.

The display panel 100 may generate light to display (or realize) the virtual images I1, I2 and I3. For example, the display panel 100 may include a light-emitting device 130 between a first substrate 110 and a second substrate 150. The light-emitting device 130 may emit light displaying a specific color. For example, the light-emitting device 130 may include a first electrode 131, a light-emitting layer 132 and a second electrode 133, which are sequentially stacked.

The first substrate 110 and the second substrate 150 may include an insulating material. For example, the first substrate 110 and the second substrate 150 may include glass or plastic.

The light-emitting layer 132 may generate light having luminance corresponding to a voltage difference between the first electrode 131 and the second electrode 132. For example, the light-emitting layer 132 may include an emission material layer (EML) having an emission material. The emission material may be an organic material. For example, in the display apparatus according to the embodiment of the present disclosure, the display panel 100 may be an organic light-emitting display device including the light-emitting layer 132 formed of an organic material.

The first electrode 131 and the second electrode 132 may include a conductive material. For example, the first electrode 131 may include a metal, such as aluminum (Al) and silver (Ag). The second electrode 132 may include a material different from the first electrode 131. For example, the second electrode 133 may be a transparent electrode formed of a transparent conductive material, such as ITO and IZO. Thus, in the display panel of the display apparatus according to the embodiment of the present disclosure, the light generated by the light-emitting layer 132 may be emitted through the second electrode 133. The second substrate 150 may include a transparent material.

A driving circuit may be disposed between the first substrate 110 and the light-emitting device 130. The driving circuit may provide driving current corresponding to a data signal applied through a data line to the light-emitting device 130 according to a gate signal applied through a gate line. For example, the driving circuit may include at least one thin film transistor 120.

The thin film transistor 120 may include a semiconductor pattern 121, a gate insulating layer 122, a gate electrode 123, an interlayer insulating layer 124, a source electrode 125 and a drain electrode 126. The semiconductor pattern 121 may include a source region, a drain region and a channel region. The gate insulating layer 122 and the gate electrode 123 may be sequentially stacked on the channel region of the semiconductor pattern 121. For example, the gate electrode 123 may be insulated from the semiconductor pattern 121 by the gate insulating layer 122. The source electrode 125 may be electrically connected to the source region of the semiconductor pattern 121. The drain electrode 126 may be electrically connected to the drain region of the semiconductor pattern 121. The source electrode 125 and the drain electrode 126 may be disposed on the interlayer insulating layer 124. For example, the interlayer insulating layer 124 may include a contact hole partially exposing the source region of the semiconductor pattern 121, and a contact hole partially exposing the drain region of the semiconductor pattern 121. The drain electrode 126 may be spaced away from the source electrode 125.

A buffer layer 112 may be disposed between the first substrate 110 and the driving circuit. For example, the buffer layer 112 may extend between the first substrate 110 and the thin film transistor 120. The buffer layer 112 may prevent pollution due to the first substrate 110 in the process of forming the thin film transistor 120. The buffer layer 112 may include an insulating material.

A lower passivation layer 114 and a planarization layer 116 may be disposed between the driving circuit and the light-emitting device 130. The lower passivation layer 114 may prevent damage of the driving circuit due to external impact and moisture. The planarization layer 116 may remove a thickness difference due to the driving circuit. For example, a surface of the planarization layer 116 opposite to the first substrate 110 may be a flat surface. The lower passivation layer 114 and the planarization layer 116 may include an insulating material. The planarization layer 116 may include a material different from the lower passivation layer 114. For example, the lower passivation layer 114 may include an inorganic insulating material, such as silicon oxide (SiO) and silicon nitride (SiN), and the planarization layer 116 may include an organic insulating material.

The lower passivation layer 114 and the planarization layer 116 may include a contact hole 114h and 116h to electrically connect the light-emitting device 130 to the driving circuit. For example, the contact hole 114h of the lower passivation layer 114 may overlap a portion of the thin film transistor 120, and the contact hole 116h of the planarization layer 116 may overlap the contact hole 114h of the lower passivation layer 114. The first electrode 131 of the light-emitting device 130 may be electrically connected to the drain electrode 126 of the thin film transistor 120 through the contact hole 114h of the lower passivation layer 114 and the contact hole 116h of the over-coat layer 116.

The light-emitting device 130 on each pixel region may be controlled independently from the light-emitting device 130 located on an adjacent pixel region. For example, the first electrode 131 of each light-emitting device 130 may be insulated from the first electrode 131 of the adjacent light-emitting device 130. A bank insulating layer 140 may be disposed on the planarization layer 116 to insulate the adjacent first electrodes 131. For example, the bank insulating layer 140 may cover an edge of each first electrode 131. The light-emitting layer 132 and the second electrode 133 of the light-emitting device 130 may be stacked on a portion of the first electrode 131 exposed by the bank insulating layer 140.

The light-emitting device 130 on each pixel region may emit light displaying the same color as the light-emitting device 130 on the adjacent pixel region. For example, the light-emitting layer 132 and the second electrode 133 of each light-emitting device 130 may be coupled with the light-emitting layer 132 and the second electrode 133 of the adjacent light-emitting device 130. The light-emitting layer 132 and the second electrode 133 of the light-emitting device 130 may extend onto the bank insulating layer 140.

A black matrix 161 and a color filter 162 may be disposed on a surface of the second substrate 150 toward the first substrate 110. The color filter 162 may be disposed between the black matrix 161. The color filter 162 may overlap the portion of the first electrode 131 exposed by the bank insulating layer 140. Thus, in the display panel of the display apparatus according to the embodiment of the present disclosure, the pixel regions may emit light displaying different colors.

An adhesive layer 170 may be disposed between the first substrate 110 in which the light-emitting device 130 is formed, and the second substrate 150 in which the black matrix 161 and the color filter 162 are formed. The second substrate 150 in which the black matrix 161 and the color filter 162 are formed may be coupled with the first substrate 110 in which the light-emitting device 130 is formed by the adhesive layer 170.

An upper passivation layer 118 may be disposed between the light-emitting device 130 and the adhesive layer 170. The upper passivation layer 118 may prevent the damage of the light-emitting device 130 due to the external impact and moisture. The upper passivation layer 118 may include an inorganic insulating material, such as silicon oxide (SiO) and silicon nitride (SiN). The upper passivation layer 118 may have a multi-layer structure. For example, the upper passivation layer 118 may have a structure in which an insulating layer formed of silicon oxide (SiO) is disposed between insulating layers formed of silicon nitride (SiN).

A hologram optical element (HOE) 200 may be disposed on a path of the light emitted from the display panel 100. For example, the hologram optical element 200 may be disposed between the display panel 100 and the wind-shield WS. The hologram optical element 200 may be attached on a surface of the wind-shield WS toward the display panel 100.

At least one condition may be recorded (or arranged) in the hologram optical element 200 to refract or reflect the light coinciding with the condition at an angle. In the hologram optical element 200, different refraction angles or the reflection angles may be recorded depending on the peak wavelength range. In other words, the hologram optical element 200 may be arranged to refract or reflect the light by the peak wavelength range—each of arranged wavelength ranges in the light is refracted or reflected at a corresponding angle by the hologram optical element 200. For example, the hologram optical element 200 may reflect the light at different angles depending on the realized color. The hologram optical element 200 may include a plurality of hologram optical layers. For example, the hologram optical element 200 may include a first hologram optical layer 210 that reflects the light L1 having a peak wavelength range of 430 nm to 490 nm representing blue color at a first angle θ1, a second hologram optical layer 220 that reflects the light L2 having a peak wavelength range of 500 nm to 570 nm representing green color at a second angle θ2, and a third hologram optical layer 230 that reflects the light L3 having a peak wavelength range of 600 nm to 660 nm representing red color at a third angle θ3, which are sequentially stacked on wind-shield WS. Thus, the display panel 100 of the display apparatus according to the embodiment of the present disclosure may realize different virtual images I1, I2 and I3 for each color by the hologram optical element 200.

Herein, the hologram optical element may include the three hologram optical layers for reflecting the light having three different peak wavelength ranges to realize three different virtual images. But the present disclosure is not limited to that. For example, the hologram optical element may include two hologram optical layers for reflecting the light having two different peak wavelength ranges to realize two different virtual images.

The first angle θ1, the second angle θ2, and the third angle θ3 may be different from each other. For example, the second angle θ2 may be a value between the first angle θ1 and the third angle θ3. Thus, in the display apparatus according to the embodiment of the present disclosure, the virtual images I1, I2 and I3 may have different focal lengths. For example, in the display apparatus according to the embodiment of the present disclosure, the focal length of green virtual image I2 due to green light L2 reflected by the second hologram optical layer 220 may be a value between the focal length of blue virtual image I1 due to blue light L1 reflected by the first hologram optical layer 210, and the focal length of red virtual image I3 due to red light L3 reflected by the third hologram optical layer 230. Thereby, in the display apparatus according to the embodiment of the present disclosure, the virtual images I1, I2 and I3 having different focal lengths may be provided to the user without physical movement or mechanical operation of the display panel 100.

Each of the virtual images I1, I2 and I3 may display different information. The information displayed by each virtual image I1, I2 and I3 may be determined according to the position where it is realized. For example, the display apparatus according to the embodiment of the present disclosure may display a lane, a distant terrain and a navigation arrow using the blue virtual image I1 having a relatively long focal length. The display apparatus according to the embodiment of the present disclosure may display pedestrian location information using the red virtual image I3 having a relatively short focal length. The display apparatus according to the embodiment of the present disclosure may display peripheral car location information using the green virtual image I2 realized between the blue virtual image I1 and the red virtual image I3.

Accordingly, the display apparatus according to the embodiment of the present disclosure may include the hologram optical element 200 on the path of the light emitted from the display panel 100. The refraction angle or the reflection angle is recorded (or arranged) in the hologram optical element 200 so the light is reflected or refracted at a certain corresponding angle based on the peak wavelength range. Thus, in the display apparatus according to the embodiment of the present disclosure, the virtual images I1, I2 and I3 having different focal lengths may be provided to the user without physical movement or mechanical operation of the display panel 100. Thereby, in the display apparatus according to the embodiment of the present disclosure, physical space may be minimized and the visibility of the user may be improved.

The display apparatus according to the embodiment of the present disclosure is described that the hologram optical element 200 has a multi-layer structure to generate the virtual images I1, I2 and I3 having different focal lengths. However, in the display apparatus according to another embodiment of the present disclosure, a signal hologram optical layer in which a plurality of conditions is recorded (or arranged) may be used. Thus, in the display apparatus according to another embodiment of the present disclosure, physical space may be efficiently reduced.

Figure 3:
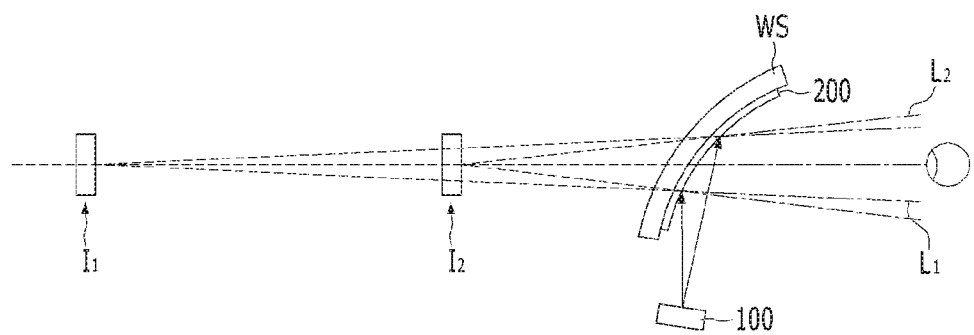
FIGS. 3 to 5 are views respectively showing the display apparatus according to another embodiment of the present disclosure.
Figure 4:
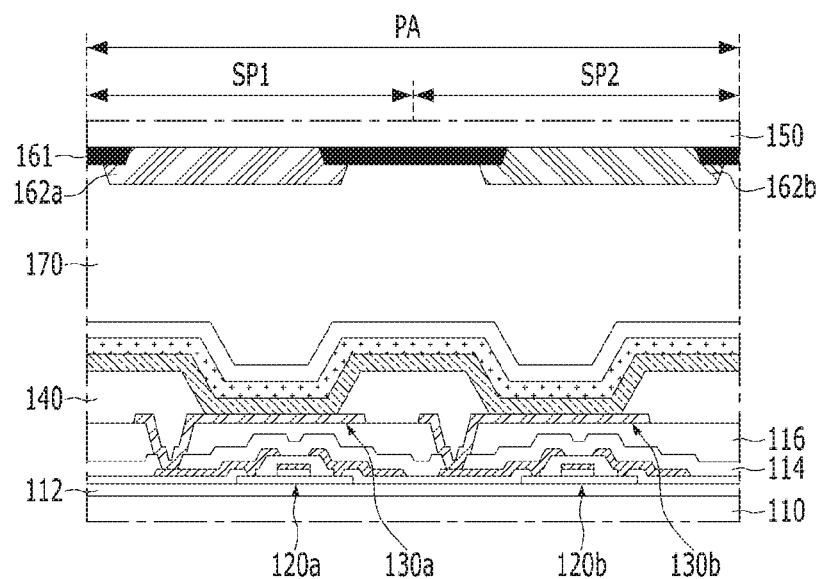

The display apparatus according to the embodiment of the present disclosure is described that different virtual images I1, I2 and I3 are realized for each color by the hologram optical element 200. However, in the display apparatus according to another embodiment of the present disclosure, virtual images having the same color may be realized at different focal length. For example, in the display apparatus according to another embodiment of the present disclosure, a single pixel region PA of the display panel 100 may be comprised of a first sub-pixel region SP1 in which a first color filter 162a is disposed, and a second sub-pixel region SP2 in which a second color filter 162b is disposed, as shown in FIGS. 3 and 4. The second color filter 162b may display the same color as the first color filter 162a. The light passing through the second color filter 162b may have a peak wavelength range different from the light passing through the first color filter 162a. For example, when the first sub-pixel region SP1 and the second sub-pixel region SP2 is a pixel region displaying green color, the light passing through the first color filter 162a may have the peak wavelength range of 500 nm to 530 nm, and the light passing through the second color filter 162b may have the peak wavelength range of 530 nm to 560 nm. That is, in the display apparatus according to another embodiment of the present disclosure, each color by the display panel 100 may be realized by light having different peak wavelength ranges. Thus, in the display apparatus according to another embodiment of the present disclosure, the light displaying the same color may be refracted or reflected by the hologram optical element 200 at different angle. For example, the display apparatus according to another embodiment of the present disclosure may realize the first virtual image I1 using the light passing through the first color filter 162a, and the second virtual image I2 using the light passing through the second color filter 162b due to the hologram optical element 200. The second color filter 162b may include a material different from the first color filter 162a.

In the display apparatus according to another embodiment of the present disclosure, all pixel regions may be composed of two sub-pixel regions. Each of the sub-pixel regions may be independently driven. For example, a first thin film transistor 120a and a first light-emitting device 130a may be disposed in the first sub-pixel regions SP1, and a second thin film transistor 120b and a second light-emitting device 130b may be disposed in the second sub-pixel region SP2. Thus, in the display apparatus according to another embodiment of the present disclosure, the virtual images I1 and I2 having different focal length may have various colors. Thereby, in the display apparatus according to another embodiment of the present disclosure, the virtual images I1 and I2 realized in various colors may be provided to the user by the hologram optical element 200.

Figure 5:
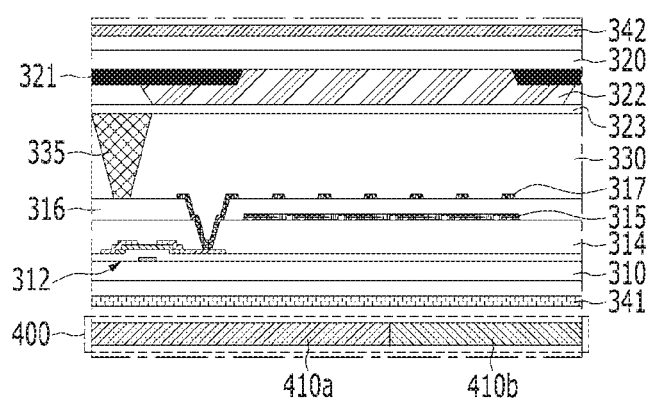

The display apparatus according to another embodiment of the present disclosure is described that the display panel 100 generates light display the same color and having different peak wavelength ranges to realize the virtual images I1 and I2 in various colors. However, the display apparatus according to further another embodiment of the present disclosure may realize virtual images using light provided from a backlight unit 400. For example, in the display apparatus according to further another embodiment of the present disclosure, the display panel may include a liquid crystal layer 330 between a first substrate 310 and a second substrate 320, and the backlight unit 400 providing the light to the liquid crystal layer 330, as shown in FIG. 5.

A thin film transistor 312, a common electrode layer 315 and a pixel electrode 317 may be disposed between the first substrate 310 and the liquid crystal layer 330 to rotate a liquid crystal of a region according to a gate signal and a data signal. The thin film transistor 312 may be covered by an over-coat layer 314. The pixel electrode 317 may be insulated from the common electrode layer 315 by an intermediate insulating layer 316. The common electrode layer 315 may be disposed between the over-coat layer 314 and the intermediate insulating layer 316. The pixel electrode 317 may be electrically connected to the thin film transistor 312 by penetrating the over-coat layer 314 and the intermediate insulating layer 316.

A black matrix 321, a color filter 322 and a capping layer 323 may be disposed between the liquid crystal layer 330 and the second substrate 320. The color filter 322 may be disposed between the black matrix 321. The capping layer 323 may be disposed between the black matrix 321 and the liquid crystal layer 330 and between the color filter 322 and the liquid crystal layer 330.

A spacer 335 may be disposed between the first substrate 310 in which the pixel electrode 317 and the common electrode layer 315 are formed, and the second substrate 320 in which the black matrix 321 and the color filter 322 are formed. A vertical distance of the liquid crystal layer 330 may be maintained by the spacer 335.

The first substrate 310 and the second substrate 320 may be disposed between a first polarizer 341 and a second polarizer 342. The second polarizer 342 may have a transmission axis perpendicular to the first polarizer 341. Thus, in the display apparatus according to further another embodiment of the present disclosure, the quality of the virtual images may be improved.

The backlight unit 400 may include a first region 410a and a second region 410b overlapping with the color filter 322. The second region 410b of the backlight unit 400 may emit light having a peak wavelength range different the first region 410a of the backlight unit 400. Thus, in the display apparatus according to further another embodiment of the present disclosure, the light displaying each color may have two peak wavelength ranges due to the first region 410a and the second region 410b of the backlight unit 400. For example, the display apparatus according to further another embodiment of the present disclosure may sequentially drive the first region 410a and the second region 410b of the backlight unit 400, so that two virtual images may be realized by the light having different peak wavelength ranges. Thereby, in the display apparatus according to further another embodiment of the present disclosure, virtual images displayed various colors may be realized without degrading the resolution.

According to at least one embodiment of the present disclosure, a display apparatus may include a display panel configured to emit light having a plurality of peak wavelength ranges, and a hologram optical element disposed on a path of the light emitted from the display panel, wherein the hologram optical element refracts the light at different refraction angles based on the peak wavelength ranges.

The light having the plurality of peak wavelength ranges may realize colors different from each other.

The hologram optical element may include a stacked structure of a plurality of hologram optical layers which refracts the light at the different refraction angles.

The plurality of peak wavelength ranges may include a first peak wavelength range and a second peak wavelength range, and wherein a refraction angle of the light having the second peak wavelength range by the hologram optical element is different from a refraction angle of the light having the first peak wavelength range by the hologram optical element.

The hologram optical element may include a stacked structure comprising a first hologram optical layer configured to refract the first peak wavelength range of the light at a first angle, and a second hologram optical layer configured to refract the second peak wavelength range of the light at a second angle that is different from the first angle.

The display panel may include a light-emitting layer between a first electrode and a second electrode.

According to at least one embodiment of the present disclosure, a display apparatus may include a hologram optical element on a wind-shield, and a display panel configured to emit light to display a plurality of images to the hologram optical element, wherein the hologram optical element reflects the light at a plurality of different reflection angles.

The hologram optical element may be in contact with a surface of the wind-shield facing the display panel.

The plurality of images may include a first image and a second image, and wherein a reflection angle of the light to display the first image by the hologram optical element is different from that of the light to display the second image by the hologram optical element.

The light emitted to display the second image and the light emitted to display the first image may have a same color.

The display panel may include a first color filter displaying a first color, and a second color filter displaying a second color, wherein the second color is different from the first color, and wherein the second color filter includes a material different from the first color filter.

The display panel may include a back-light unit having a first light source and a second light source, wherein the second light source emits light displaying the same color as the first light source, and wherein a peak wavelength range of light emitted from the second light source is different from a peak wavelength range of light emitted from the first light source.

The plurality of images may display different information according to positions where the plurality of images are displayed.

In the result, the display apparatus according to the embodiments of the present disclosure may include the hologram optical element on the path of the light emitted from the display panel, the refraction angle or the reflection angle recorded in the hologram optical element being vary depending on the peak wavelength range. Thus, the display apparatus according to the embodiments of the present disclosure may provide the virtual images having different focal lengths to the user without physical movement or mechanical operation of the display panel. Thereby, in the display apparatus according to the embodiment of the present disclosure, physical space may be minimized and the visibility of the user for the virtual images may be improved.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

The various embodiments described above can be combined to provide further embodiments. Further changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A display apparatus, comprising:
a display panel configured to emit light having a plurality of peak wavelength ranges, the display panel including a plurality of pixel areas on a substrate, each of the pixel areas including:

a first sub-pixel that, in operation, emits first light having a first peak wavelength range; and a second sub-pixel that, in operation, emits second light having a second peak wavelength range different than the first peak wavelength range, the second sub-pixel being disposed spaced from the first sub-pixel in a second direction;

a windshield spaced a first distance from both the first sub-pixel and the second sub-pixel of each pixel area along a first direction that is transverse to the second direction, both the first and second sub-pixels having the same length optical path to the windshield;

a hologram optical element overlying the windshield and disposed in a direct path between that of the first light and the second light emitted from the display panel and the windshield, the path being along the first direction, the light emitted directly from the display panel impinging directly on the hologram optical element;

a first hologram optical layer within the hologram optical element, the first hologram optical layer refracting light of the first peak wavelength to have a first focal length at a first focal point on the windshield; and a second hologram optical layer within the hologram optical element, the second hologram optical layer refracting light of the second peak wavelength to have a second focal length at a second focal point on the windshield;

wherein the hologram optical element refracts the first lights and the second lights at different refraction angles based on the first peak wavelength and the second peak wavelength to create a first virtual image on the windshield realized by the first lights and a second virtual image on the windshield realized by the second lights, the first virtual image and the second virtual image having different focal lengths from each other and appearing to be at different distance as observed by a user, and wherein the first and second virtual images are different virtual images that display different information at different focal lengths at a same time.

2. The display apparatus according to claim 1, wherein the light having the plurality of peak wavelength ranges realizes colors different from each other.

3. The display apparatus according to claim 1, wherein the hologram optical element includes a stacked structure of a plurality of hologram optical layers which refracts the light at the different refraction angles.

4. The display apparatus according to claim 1, wherein a refraction angle of the second light having the second peak wavelength range by the hologram optical element is different from a refraction angle of the first light having the first peak wavelength range by the hologram optical element.

5. The display apparatus according to claim 4, wherein the hologram optical element includes a stacked structure comprising:

the first hologram optical layer configured to refract the first peak wavelength range of the first light at a first angle, and the second hologram optical layer configured to refract the second peak wavelength range of the second light at a second angle that is different from the first angle.

6. The display apparatus according to claim 1, wherein the display panel includes a light-emitting layer between a first electrode and a second electrode, and the light-emitting layer, in operation, generates light having luminance corresponding to a voltage difference between the first electrode and the second electrode.

7. The display apparatus according to claim 6, wherein the light-emitting layer extends through the first sub-pixel and the second sub-pixel in a continuous manner.

8. A display apparatus, comprising:

a hologram optical element on a wind-shield; and a display panel emitting first light to display a first image and second light to display a second image toward the hologram optical element in a first direction, the display panel including a plurality of pixel areas on a substrate, each of the plurality of pixel areas including:

a first sub-pixel in which the first light is emitted;

a second sub-pixel in which the second light is emitted, the second sub-pixel being disposed spaced from the first sub-pixel in a second direction transverse the first direction;

a first hologram optical layer within the hologram optical element, the first hologram optical layer refracting light of a first peak wavelength to have a first focal length at a first focal point on the wind-shield; and a second hologram optical layer within the hologram optical element, the second hologram optical layer refracting light of a second peak wavelength to have a second focal length at a second focal point on the wind-shield;

wherein the wind-shield is spaced a first distance from both the first sub-pixel and the second sub-pixel of each pixel area along the first direction, both the first and second sub-pixels having the same length optical path in a direct line to the wind-shield;

wherein the hologram optical element is overlying the wind-shield and disposed on a direct path between that of the first light and the second light emitted from the display panel and the wind-shield, the path being along the first direction;

wherein the hologram optical element refracts the first light and the second light at different refraction angles to cause the second image on the wind-shield to have a different focal length from the first image on the wind-shield and appear to be at different distances as observed by a user, wherein the first and second images are different images that display different information at the different distances at a same time.

9. The display apparatus according to claim 8, wherein the hologram optical element is in contact with a surface of the wind-shield facing the display panel.

10. The display apparatus according to claim 8, wherein each of the first image and the second image includes a plurality of colors.

11. The display apparatus according to claim 8, wherein the second light emitted to display the second image and the first light emitted to display the first image have a same color.

12. The display apparatus according to claim 11, wherein the display panel includes a first color filter displaying a first color on the first sub-pixel of each pixel area, and a second color filter displaying a second color on the second sub-pixel of each area, wherein the second color is different from the first color, and wherein the second color filter includes a material different from the first color filter.

13. The display apparatus according to claim 11, wherein the display panel includes a back-light unit including a first light source and a second light source,
  wherein the first light source provides the first light to the first sub-pixel of each pixel area, and the second light source provides the second light to the second sub-pixel of each pixel area,
  wherein the second light has the same color as the first light, and
  wherein a peak wavelength range of the second light emitted from the second light source is different from a peak wavelength range of the first light emitted from the first light source.

14. A display apparatus, comprising:
  a display panel including a plurality of pixel areas on a substrate, each of the plurality of pixel areas including a first sub-pixel emitting a first light displaying a first color and a second sub-pixel emitting a second light displaying a second color different than the first color, the first sub-pixel and the second sub-pixel being arranged side by side in a second direction;
  a windshield spaced a first distance from both the first sub-pixel and the second sub-pixel along a first direction that is transverse to the second direction, both the first and second sub-pixels having the same length optical path to the windshield;
  a hologram optical element overlying the windshield and disposed in a direct path between that of the first light and the second light emitted from the display panel and the windshield, the path being along the first direction,
  a first hologram optical layer within the hologram optical element, the first hologram optical layer refracting light of a first color to have a first focal length at first focal point on the windshield; and
  a second hologram optical layer within the hologram optical element, the second hologram optical layer refracting light of a second color to have a second focal length at second focal point on the windshield;
  wherein the hologram optical element refracts the first light and the second light at different refraction angles to create a first virtual image on the windshield realized by the first light and a second virtual image on the windshield realized by the second light, wherein a focal length of the first virtual image is different from a focal length of the second virtual image and the first and second virtual images appear to be at different distances as observed by a user, and
  wherein the first and second virtual images are different images that display different information at different focal lengths at a same time.

15. The display apparatus according to claim 14, wherein each of the plurality of pixel areas further includes a third sub-pixel on the substrate, the third sub-pixel emitting a third light displaying a third color different than the first color and the second color,
  wherein the third sub-pixel is arranged side by side with the first sub-pixel and the second sub-pixel,
  wherein the hologram optical element refracts the third light at a different refraction angle from the first light and the second light to create a third virtual image realized by the third light,
  wherein a focal length of the third virtual image is different from the focal length of the first virtual image and the focal length of the second virtual image, and
  wherein the first, second and third virtual images are different images that display different information at different focal lengths at the same time.

16. The display apparatus according to claim 15, wherein the first color is blue, the second color is green and the third color is red, and
  wherein the focal length of the second virtual image is between the focal length of the first virtual image and the focal length of the third virtual image.

17. The display apparatus according to claim 14, wherein the display panel includes a first color filter on the first sub-pixel and a second color filter on the second sub-pixel, and
  wherein the second color filter realizes a color different from a color of the first color filter.

18. The display apparatus according to claim 17, wherein the display panel includes a first light-emitting device between the substrate and the first color filter and a second light-emitting device between the substrate and the second color filter, and
  wherein the second light-emitting device emits light displaying the same color as the first light-emitting device.

* * * * *